(12) United States Patent
Pöchmüller

(10) Patent No.: US 6,646,937 B2
(45) Date of Patent: Nov. 11, 2003

(54) INTEGRATED CLOCK GENERATOR, PARTICULARLY FOR DRIVING A SEMICONDUCTOR MEMORY WITH A TEST SIGNAL

(75) Inventor: Peter Pöchmüller, Colchester, VT (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/119,607

(22) Filed: Apr. 10, 2002

(65) Prior Publication Data

US 2002/0145926 A1 Oct. 10, 2002

(30) Foreign Application Priority Data

Apr. 10, 2001 (DE) .......................................... 101 17 891

(51) Int. Cl.[7] ................................................ G11C 7/00
(52) U.S. Cl. ........................................ 365/201; 365/233
(58) Field of Search ............................... 365/201, 233, 365/236, 194; 327/158, 151, 156

(56) References Cited

U.S. PATENT DOCUMENTS

| | | | |
|---|---|---|---|
| 6,043,694 A | 3/2000 | Dortu | 327/156 |
| 6,128,248 A * | 10/2000 | Idei et al. | 365/233 |
| 6,456,130 B1 * | 9/2002 | Schnell | 327/156 |
| 6,492,852 B2 * | 12/2002 | Fiscus | 327/158 |
| 2002/0012283 A1 * | 1/2002 | Ernst et al. | 365/201 |

FOREIGN PATENT DOCUMENTS

JP    2000 124 795 A    4/2000

* cited by examiner

*Primary Examiner*—Anh Phung
(74) *Attorney, Agent, or Firm*—Laurence A. Greenberg; Werner H. Stemer; Ralph E. Locher

(57) ABSTRACT

An integrated clock generator, particularly for driving a semiconductor memory with a test signal, in which a delay locked loop is provided which, in a first mode of operation, synchronizes an input signal with a reference signal and, in a second, freewheeling mode of operation, uses a connected adder to form a precisely settable delay between the test signal and the reference signal. To change over between the first mode of operation and the second mode of operation, a selection circuit is provided. The delay locked loop is connected to the I/O interface of the integrated circuit, so that the BIST data produced are advantageously available directly at the input of the semiconductor memory. The principle described affords a simple way of providing test signals which have a highly precise delay with respect to a reference signal, as is necessary for DRAMs with a great storage density, for example.

10 Claims, 1 Drawing Sheet

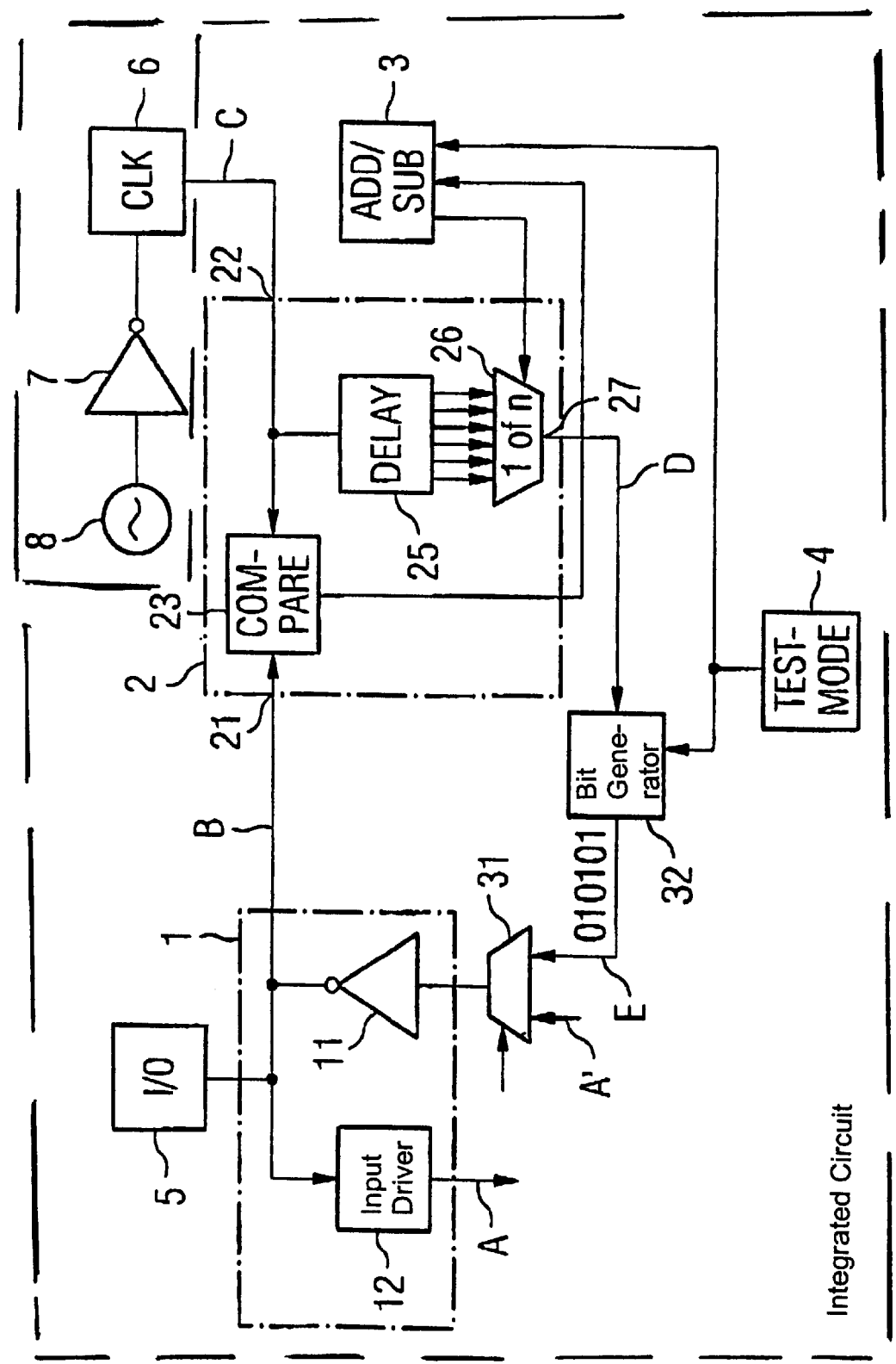

INTEGRATED CLOCK GENERATOR, PARTICULARLY FOR DRIVING A SEMICONDUCTOR MEMORY WITH A TEST SIGNAL

BACKGROUND OF THE INVENTION

Field of the Invention

The present invention relates to an integrated clock generator, particularly for driving a semiconductor memory with a test signal.

Dynamic random access memory (DRAM) chips with high and increasingly great storage densities are tested using cost-intensive memory test systems. In this context, the testers use test programs to check the operability of the memory chips. This involves applying signals with precisely defined voltage levels to the semiconductor circuit to be tested at exactly defined times. While a read function of a device under test (DUT) is being checked, it is furthermore possible to read signals coming from the DUT into the test unit at precisely defined times and to compare them with expected signal values. The specifications of DRAMs manufactured today already require degrees of timing precision down to a few tens of picoseconds for test purposes; for example "address setup timing" of 200 picoseconds requires that address data be tested for availability exactly 200 picoseconds before the rising edge of a clock signal.

Since the memory tests described which have the high demands on precision which have been described, already result in high production and test costs today, it is desirable for the test costs to be reduced by virtue of function tests on the memory chips, particularly high-frequency tests, allowing testing first at an early time in the value-adding chain and second without the need for cost-intensive test equipment, as a result of the incorporation of self-test facilities on the memory chip itself.

SUMMARY OF THE INVENTION

It is accordingly an object of the invention to provide a integrated clock generator, particularly for driving a semiconductor memory with a test signal that overcomes the above-mentioned disadvantages of the prior art devices of this general type, which is inexpensive to produce and at the same time satisfies the described high demands on the timing precision of the signals produced.

With the foregoing and other objects in view there is provided, in accordance with the invention, an integrated clock generator. The clock generator contains an input/output interface for inputting or outputting data to or from the integrated clock generator, a clock source outputting a reference signal, and a delay locked loop having a first input coupled to the input/output interface for receiving an input signal from the input/output interface. The delay locked loop has a second input coupled to the clock source and receiving the reference signal. The delay locked loop has an output providing an output clock signal based on the input signal and the reference signal and is coupled to the input/output interface. A selection circuit is coupled to the delay locked loop for changing over from a first, synchronizing mode of operation to a second, freewheeling mode of operation. An adder/subtractor is coupled to the delay locked loop for providing a settable delay between the input signal and the reference signal in the second, freewheeling mode of operation.

The integrated circuit having the delay locked loop is based on the principle that, initially, in the first mode of operation, the input signal is synchronized with the reference clock signal, and then, in the second mode of operation, during which the feedback for the delay locked loop is removed, the adder can be used to produce a desired delay between the input signal and the reference signal. This affords a simple way of providing the desired, exact timing for implementing a built-in self-test (BIST) on semiconductor memory chips.

During the first mode of operation, synchronization can be effected, by way of example, by virtue of the adder adding a delay of 0, which thus permits precise synchronization between the input signal and the reference signal.

In the first mode of operation, the delay locked loop described corresponds to a conventional delay locked loop (DLL).

Since the principle described allows a highly precise delay for a data signal with respect to a reference clock signal, the integrated circuit described can be used, in particular, for driving semiconductor memories, for example DRAMs, whose test specifications demand degrees of precision in the picosecond range.

By way of example, the integrated circuit described can be used to generate a test data signal precisely 200 ps before the rising edge of the reference clock.

The integrated circuit can be integrated in a semiconductor memory chip and is accordingly suitable for providing a BIST.

Since the test signal mode, namely the second mode of operation, is normally required only for short periods of time during a BIST, no problems arising from possible temperature drifts are to be expected for the described simple configuration of the circuit with an open-loop mode for the delay locked loop.

The principle described allows a significant reduction in the considerable test costs for DRAMs, and hence a reduction in the production costs for DRAMs as a whole.

The simple manner in which the principle described can be implemented results in that it can be applied inexpensively, for example in mass production.

In one preferred development of the invention, an adder/subtractor included by the delay locked loop is coupled to the selection circuit for the purpose of blocking upward and downward counting during the second mode of operation.

To compare an input signal with a reference signal, a delay locked loop normally has a comparator having a downstream adder/subtractor that is driven on the basis of the signal difference between the two input signals on the comparator. To remove the synchronization during the second mode of operation by interrupting the feedback for the delay locked loop, it is easy to effect the interruption in the present integrated circuit by virtue of the upward and downward counting being blocked during the second mode of operation. Therefore, no further regulation by the delay locked loop is possible. The latter is therefore in an open-loop mode, which results in that a programmable and hence highly precise delay can be set between the input signal and the clock signal, which had been synchronized to one another beforehand.

Since the up/down counter described is normally present in delay locked loops anyway, it is possible to change over between the first mode of operation and the second mode of operation with particularly little complexity.

In another preferred embodiment of the invention, the delay locked loop contains a delay module whose input side is coupled to the clock source for the purpose of transmitting the reference signal and whose output side provides signals which have graduated delays and are derived from the reference signal. The delay locked loop also contains a multiplexer having a control input that is connected to an output of the adder/subtractor.

Such a delay device, known as a "delay line", provides a number n of signals which are derived from the clock signal and each have a graduated delay, differing from that of the others, with respect to the reference clock signal. The multiplexer is driven by the adder/subtractor and selects one of the delay lines of the delay module according to the difference between the input signal and the reference clock signal. In this case, the multiplexer is in the form of a (1-of-n) multiplexer.

Such a delay module with a downstream multiplexer allows particularly fast locking of the delay locked loop with a particularly simple configuration.

In addition, the adder already described can easily be coupled to the delay module and to the multiplexer for the purpose of providing a settable delay in the second mode of operation.

In another, preferred embodiment of the present invention, the input/output interface contains an output driver whose output side is coupled to the first input of the delay locked loop and whose input side is coupled to the output of the delay locked loop.

Such an output driver in an integrated circuit is known as an "off-chip driver" (OCD). Such output drivers are normally used for driving data, for example test data, from a semiconductor memory chip to the outside, that is to say into a unit connected to the chip, via an I/O pad connected to the output of the output drivers. On the basis of the preferred embodiment, the output driver is connected into the feedback chain of the delay locked loop, which results in that the highly precise test signals which can be produced with the described configuration are available directly on the input/output interface of a semiconductor memory.

The particular feature in this case is that the off-chip driver OCD normally present anyway can also be used for providing test signals, and hence the highly precise test signals provided can be supplied to an integrated semiconductor memory as far outside as possible, namely on its I/O pad, which allows as many parts of the semiconductor memory as possible to be tested very realistically.

In another, preferred embodiment of the present invention, the input of the output driver has a multiplexer connected to it which has a first input, to which a data signal can be supplied, and which has a second input, which is coupled to the output of the delay locked loop.

Despite the joint use of the OCD by the delay locked loop, the multiplexer described can also be used to allow conventional use of the input/output interface of the integrated circuit, since it is normally possible for data signals needing to be driven from the integrated circuit to the outside to be provided on an I/O pad of the input/output interface by the output driver as a result of changing over using the multiplexer.

In another, preferred embodiment of the present invention, to couple the first input and the output of the delay locked loop, a bit pattern generator is provided whose output provides a bit pattern having the frequency of the output clock signal.

The bit pattern which can be provided is preferably a periodic bit pattern, for example an alternating sequence of logic ones and zeros.

Accordingly, the bit pattern generator makes it possible to provide the input signal from the output clock signal of the delay locked loop.

In another, preferred embodiment of the present invention, the input/output interface contains an input driver for driving a semiconductor memory.

In this case, the input of the input driver is connected directly to the output of the output driver and at the same time can be activated thereby, so that the highly precise test signals which can be produced with the integrated circuit can be supplied directly on a connection on the semiconductor memory which is as far outside as possible, and hence the quality of the BIST provided by the principle described is just as high as if the test signals were supplied on the I/O pad of the semiconductor memory, that is to say having been produced outside the semiconductor memory chip.

In another, preferred embodiment of the present invention, the clock source is provided in the form of an external source, that is to say is formed outside the integrated circuit and outside the semiconductor memory chip, and is connected to the integrated circuit via a clock pad. The clock source can be used, by way of example, to provide a reference signal having a clock frequency of 400 MHz.

In an alternative, preferred embodiment of the present invention, the clock source is formed internally in the integrated circuit.

Other features which are considered as characteristic for the invention are set forth in the appended claims.

Although the invention is illustrated and described herein as embodied in a integrated clock generator, particularly for driving a semiconductor memory with a test signal, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

The single FIGURE of the drawing is a block circuit diagram of an illustrative embodiment according to the invention.

DESCRIPTION OF THE PREFERRED EMBODIMENTS

Referring now to the single feature of the drawing, there is shown an integrated circuit for driving a semiconductor memory with a test signal. The integrated circuit has an input/output interface 1, a delay locked loop 2, an adder 3 and a selection circuit 4 for activating a test mode of operation. The integrated circuit is shown in dashed lines and may or may not contain the clock generation system 6, 7, 8.

The input/output interface 1 contains an output driver 11 and an input driver 12 whose input is connected to the output of the output driver 11. The output driver 11 is in the form of an "off-chip driver" (OCD), while the input driver 12 is in the form of a receiver. An output of the output driver 11 and the input of the input driver 12 are connected directly to a pad on the integrated circuit, which affords an external channel of connection. The pad is provided with the reference symbol 5.

The input/output interface 1 is used for transmitting data signals A, A' both in the reading direction and in the writing direction for the integrated semiconductor memory.

The delay locked loop 2 is provided with a first input 21 and with a second input 22, which are connected to a respective input of a comparator 23. The comparator 23 compares the two input signals with one another and, at its output, provides a signal that is dependent on the difference between them. The output of the comparator 23 has an adder/subtractor 3 connected to it. In this mode of operation, the adder/subtractor 3 for the delay locked loop (DLL) counts upward or downward on the basis of the comparison signal, according to whether the input signal B applied to the first input 21 leads or lags the reference signal C applied to the input 22.

The second input 22, for supplying the reference signal C, is also connected to an input for a delay module 25 whose n outputs provide a number n of signals which are derived from the reference signal C and have graduated delays with respect thereto. Connected to the n outputs of the delay device 25 is a (1-of-n) multiplexer 26 whose output provides one of the n output signals from the delay module 25, on the basis of the signal that is produced at the output of the adder/subtractor 3. At the same time, the output of the multiplexer 26 forms an output 27 of the delay locked loop 2, at which output 27 an output clock signal D can be derived. The output 27 is coupled to the first input 21 of the delay locked loop 2 in a feedback path 11, 31, 32.

To provide the reference signal C, a clock source 8 which, in the present exemplary embodiment, provides a reference clock frequency of 400 MHz is connected via a further pad 6 and via a driver module 7.

The aforementioned feedback path for the delay locked loop 2 contains not only the output driver 11 which has already been described and is in the form of an off-chip driver but also a multiplexer 31 and a bit pattern generator 32.

An input of the bit pattern generator 32 is connected to the output 27 of the delay locked loop 2 in order for the output clock signal D to be supplied. The output of the bit pattern generator 32 provides a test signal E, which contains a periodic sequence of ones and zeros and whose frequency corresponds to the frequency of the output clock signal D. The output of the bit pattern generator 32 is connected to one input of the multiplexer 31, another input of which can be coupled to the semiconductor memory in order for a data signal A' to be supplied. The multiplexer 31 also has a changeover input which, when supplied with a changeover signal, can be used to change over from a data mode, in which the data signal A' is switched through to the output, to a test mode, in which the test signal E is passed to the output of the multiplexer 31. To this end, the changeover input is connected to a selection circuit 4.

The feedback path for the delay locked loop 2 is accordingly closed via the bit pattern generator 32, the multiplexer 31 and the output driver 11 in the I/O interface 1 of the integrated circuit.

To change over from the first mode of operation to the second mode of operation of the delay locked loop and hence to change over from a synchronization mode to a freewheeling test signal generation mode, the selection circuit 4 is coupled both to the bit pattern generator 32 and to the adder/subtractor 3 in order to drive them.

During the first mode of operation of the circuit shown, the delay locked loop 2 needs to be fed back in a closed control loop in order to synchronize the signal B to the reference signal C. For this, the adder unit 3 adds or subtracts the value 1 according to the result from the comparator 23. Accordingly, no additional delay is formed between the input signal B and the reference signal C.

On the basis of the counting result from the adder/subtractor 3, as already mentioned, the multiplexer 26 provides a signal having a predeterminedly settable delay at the output 27. The signal is referred to as the output clock signal D. The bit pattern generator 32 produces a bit sequence 1 0 1 0 1 0 . . . , which follows the frequency of the output clock signal D. On the basis of this principle, during the first mode of operation, the delay locked loop 2 constantly compares the input signal B with the reference signal C and counts upward or downward until the signals B, C are exactly identical. This is the known principle of a delay locked loop for synchronizing two signals to one another.

After the input signal B has been synchronized to the reference signal C, however, the present circuit can be changed over to a second mode of operation, for producing test signals with a precisely settable delay. For this, the adder 3 is changed over using the selection circuit 4 such that a programmable value corresponding to a desired delay can be added to or subtracted from the previous addition/subtraction result. At the same time, the synchronization of the delay locked loop is interrupted in the process by removing the feedback. In the second mode of operation, the delay locked loop 2 is consequently in a freewheeling mode which is also referred to as an "open-loop mode".

Since the adder unit 3 can add or subtract any desired, programmable value to or from the comparison result of the delay locked loop, it is possible to produce any, highly precise, time delays for the signal B with respect to the reference signal C.

Since test modes of operation in semiconductor memories normally have short cycles, the principle described leaves no expectation of any drift in the precisely set delay between the test signal E and the reference signal C on account of temperature drifts. If necessary, however, a test mode, that is to say the second mode of operation of the integrated circuit, can be interrupted for the purpose of quickly resynchronizing the input signal B to the reference signal C.

The present invention allows highly precise test signals, particularly in terms of their timing, to be produced for the purpose of testing the operability of semiconductor memories.

In this case, the test signals can advantageously be produced on the semiconductor memory chip itself in the form of a BIST, Built-In Self-Test. In this context, the output driver 11 which is present anyway on the semiconductor memory chip is also used in the feedback path for the delay locked loop 2, and hence the test signals produced are available on the desired connection, namely at the input of the semiconductor memory's input driver 12.

Instead of the external clock source shown, it would also be possible for an internal clock source to be integrated on the integrated circuit as well.

I claim:

1. An integrated clock generator, comprising:
   an input/output interface for inputting or outputting data to or from the integrated clock generator;
   a clock source outputting a reference signal;
   a delay locked loop having a first input coupled to said input/output interface for receiving an input signal from said input/output interface, said delay locked loop having a second input coupled to said clock source and receiving the reference signal, said delay locked loop having an output providing an output clock signal based on the input signal and the reference signal and coupled to said input/output interface;

a selection circuit coupled to said delay locked loop for changing over from a first, synchronizing mode of operation to a second, freewheeling mode of operation; and an adder/subtractor coupled to said delay locked loop for providing a settable delay between the input signal and the reference signal in the second, freewheeling mode of operation.

2. The integrated clock generator according to claim 1, wherein said adder/subtractor is coupled to said selection circuit for blocking upward and downward counting during the second, freewheeling mode of operation.

3. The integrated clock generator according to claim 2, wherein:

said delay locked loop contains a delay module having an input side coupled to said clock source for transmitting the reference signal and an output side providing signals which have graduated delays and are derived from the reference signal;

said adder/subtractor has an output; and said delay locked loop contains a multiplexer having a control input connected to said output of said adder/subtractor.

4. The integrated clock generator according to claim 1, wherein said input/output interface has an output driver with an output coupled to said first input of said delay locked loop and an input coupled to said output of said delay locked loop.

5. The integrated clock generator according to claim 4, including a multiplexer connected to said input of said output driver, said multiplexer having a first input for receiving a data signal and a second input coupled to said output of the delay locked loop.

6. The integrated clock generator according to claim 1, including a bit pattern generator for coupling said first input and said output of said delay locked loop, said bit pattern generator having an output outputting a bit sequence having a frequency of the output clock signal.

7. The integrated clock generator according to claim 1, wherein said input/output interface contains an input driver for driving a semiconductor memory.

8. The integrated clock generator according to claim 1, further comprising an integrated circuit containing said input/output interface, said delay locked loop, said selection circuit and said adder/subtractor, said clock source is an external source to said integrated circuit and has a pad for connecting to said delay locked loop.

9. The integrated clock generator according to claim 1, further comprising an integrated circuit containing said input/output interface, said delay locked loop, said selection circuit said adder/subtractor, and said clock source.

10. In combination with a semiconductor memory, an integrated clock generator for driving the semiconductor memory with a test signal, the integrated clock generator comprising:

an input/output interface for inputting or outputting data to or from the integrated clock generator;

a clock source outputting a reference signal;

a delay locked loop having a first input coupled to said input/output interface for receiving an input signal from said input/output interface, said delay locked loop having a second input coupled to said clock source and receiving the reference signal, said delay locked loop having an output providing an output clock signal based on the input signal and the reference signal and coupled to said input/output interface;

a selection circuit coupled to said delay locked loop for changing over from a first, synchronizing mode of operation to a second, freewheeling mode of operation; and an adder/subtractor coupled to said delay locked loop for providing a settable delay between the input signal and the reference signal in the second, freewheeling mode of operation.

* * * * *